United States Patent
Kubo et al.

(10) Patent No.: US 6,771,135 B2
(45) Date of Patent: Aug. 3, 2004

(54) TEMPERATURE-COMPENSATED CRYSTAL OSCILLATOR

(75) Inventors: Kuichi Kubo, Saitama (JP); Fumio Asamura, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/370,177

(22) Filed: Feb. 19, 2003

(65) Prior Publication Data

US 2003/0155984 A1 Aug. 21, 2003

(30) Foreign Application Priority Data

Feb. 20, 2002 (JP) .......................................... 2002-043824

(51) Int. Cl.[7] .............................. H03B 5/32; H03L 1/02
(52) U.S. Cl. ......................... 331/66; 331/68; 331/158; 331/176
(58) Field of Search ............................... 331/65, 66, 68, 331/70, 116 R, 116 FE, 158, 175–176; 310/315

(56) References Cited

U.S. PATENT DOCUMENTS 6,366,175 B2 * 4/2002 Oka ........................ 331/116 R

* cited by examiner

Primary Examiner—David Mis
(74) Attorney, Agent, or Firm—Knobbe Martens Olson & Bear LLP

(57) ABSTRACT

A temperature-compensated crystal oscillator (TCXO) comprises a voltage-controlled crystal oscillator (VCXO) having a crystal unit, a compensating voltage generator for generating a compensating voltage applied to the voltage-controlled crystal oscillator, a low pass filter inserted between the compensating voltage generator and voltage-controlled crystal oscillator, and a switching element connected in parallel with the low pass filter for short-circuiting across the low pass filter. In a manufacturing process of the temperature-compensated crystal oscillator, switching element is brought into a conducting state when an excitation electrode of the crystal unit is irradiated with an ion beam for adjusting the oscillation frequency.

7 Claims, 3 Drawing Sheets

TEMPERATURE-COMPENSATED CRYSTAL OSCILLATOR

BACKGROUND OF THE INVENTION

1. Field of the Invention

The present invention relates to a temperature-compensated crystal oscillator (TCXO), and more particularly, to a temperature-compensated crystal oscillator which maintains a satisfactory phase noise characteristic and facilitates adjustments to its oscillation frequency.

2. Description of the Related Arts

A temperature-compensated crystal oscillator compensates variations in frequency due to a frequency-temperature characteristic of a quartz crystal unit to stably maintain the oscillation frequency notwithstanding a change in ambient temperature. Such a temperature-compensated crystal oscillator is widely used as a frequency source particularly in a portable telephone and the like which is used in a mobile environment. In recent years, the temperature-compensated crystal oscillator is required to excel in the phase noise characteristic, needless to say that it must be small in size and low in cost.

FIG. 1 illustrates an exemplary configuration of a conventional temperature-compensated crystal oscillator of a voltage-controlled type. The illustrated temperature-compensated crystal oscillator comprises voltage-controlled crystal oscillator (VCXO) 1; compensating voltage generator (COMP) 2 for generating a compensating voltage which is applied to the voltage-controlled crystal oscillator 1 as a control voltage; low pass filter (LPF) 3; and switching element 4. Voltage-controlled crystal oscillator 1 generally comprises crystal unit 5; two voltage variable capacitance elements connected to both ends of crystal unit 5, respectively, to form a resonator circuit together with crystal unit 5; and inverter 7 for oscillation which amplifies a current of the resonator circuit and feeds back the amplified current. Variable capacitance diodes 6 are used herein for the voltage variable capacitance elements, and each has a grounded anode and a cathode connected to crystal unit 5. Feedback resistor 8 is inserted to connect an input terminal to an output terminal of inverter 7. The input terminal and output terminal of inverter 7 are connected to the resonator circuit, respectively, through DC blocking capacitors 9. Oscillation output Vout is generated from the output terminal of inverter 7.

Crystal unit 5 is made, for example, of an AT-cut quartz crystal blank, and its frequency-temperature characteristic is represented by a cubic function curve as indicated by curve A in FIG. 2. In FIG. 2, the vertical axis represents a frequency deviation $\Delta f/f$, where f is the frequency at 25° C. Due to the use of such crystal unit 5 having the frequency-temperature characteristic as illustrated, the crystal oscillator also exhibits a similar frequency-temperature characteristic in its oscillation frequency.

Compensating voltage generator 2 comprises a temperature sensor connected to power supply Vcc for detecting, for example, an ambient temperature; and a cubic function generator for generating a voltage which changes in accordance with a cubic function in response to a detected temperature. Compensating voltage generator 2 generates compensating voltage Vc in response to the ambient temperature. Compensating voltage Vc is applied to the cathode of each variable capacitance diode 6 through high frequency blocking resistor 10. Each of variable capacitance diode 6 changes the capacitance between the anode and cathode terminals in response to compensating voltage Vc applied thereto, resulting in a change in an equivalent series capacitance (load capacitance) viewed from crystal unit 5 to cause a change in the oscillation frequency. Compensating voltage Vc is set herein to change in response to the temperature in accordance with a cubic function curve, as indicated by curve B in FIG. 2, to compensate the crystal oscillator for the frequency-temperature characteristic so that the characteristic curve becomes flat.

Low pass filter 3, which comprises a CR time constant circuit composed of capacitor (C) 11 and resistor (R) 12, is inserted between voltage-controlled crystal oscillator 1 and compensating voltage generator 2. Compensating voltage Vc from compensating voltage generator 2 is applied to variable capacitance diodes 6 through low pass filter 3, thereby removing low frequency noise components possibly included in compensating voltage Vc.

Low pass filter 3 comprising a CR time constant circuit, provided as mentioned above, causes a delay in applying compensating voltage Vc to variable capacitance diodes 6 upon start of the temperature-compensated crystal oscillator, thereby exacerbating the starting characteristic of the oscillator. To solve this problem, the temperature-compensated crystal oscillator has switching element 4 connected in parallel with low pass filter 3 such that low pass filter 3 is short-circuited upon starting. Specifically, switching element 4 is connected in parallel with resistor 12 of the time constant circuit, and short-circuits resistor 12 only in the event of starting the temperature-compensated crystal oscillator, and is turned off after the starting. This avoids the delay in the operation upon starting due to the CR time constant circuit, resulting in a satisfactory starting characteristic. Switching element 4 is controlled by starting control circuit (START CNTL) 13 connected to power supply Vcc.

Starting control circuit 13 comprises PNP transistor 18 connected between power supply Vcc and switching element 4; resistor 19 connected between the base of PNP transistor 18 and a ground point; and capacitor 20 connected between the base and power supply Vcc, for example, as illustrated in FIG. 3. With this circuit configuration, PNP transistor 18 conducts to turn on switching element 4 when the crystal oscillator is powered on. Subsequently, the base voltage increases to the same potential as power supply Vcc by a time constant determined by capacitor 20 and resistor 19 to turn off PNP transistor 18, thereby turning off switching element 4.

The respective circuits, which form the temperature-compensated crystal oscillator, are generally integrated in a single IC (integrated circuit) chip except for crystal unit 5.

Then, the temperature-compensated crystal oscillator is assembled, for example, as illustrated in FIG. 4, by securing IC chip 15 on the bottom of a recess formed in container body 14 made of laminated ceramic, for example, by face down bonding, and securing one end of quartz crystal blank 5A, which constitutes crystal unit 5, on a step formed on the recess with a conductive adhesive. Excitation electrodes 17 are formed on both main surfaces of crystal piece 5A. Then, one of excitation electrodes 17 on crystal blank 5A is irradiated with an ion beam, as indicated by arrow P in FIG. 4, to reduce the thickness of excitation electrode 17 in order to adjust the oscillation frequency of the oscillator, such that the oscillation frequency matches a reference frequency. Stated another way, the oscillation frequency is adjusted by decreasing an additional mass to crystal unit 5. The reference frequency used herein refers to a so-called nominal frequency at which oscillation should be carried out, for example, at a room temperature. After the adjustment is completed for the oscillation frequency, a lid member is placed to cover the recess of container body 14 to encapsulate crystal blank 5A and IC chip 15 within the recess, thereby completing the temperature-compensated crystal oscillator. A circuit pattern is formed on the surface of the recess of container body 14 for electrically connecting IC chip 15 to crystal blank 5A, and electrode portions are formed on the outer surface of container body 14 for connecting the temperature-compensated crystal oscillator to an external circuit.

However, the temperature-compensated crystal oscillator in the foregoing configuration suffers from the inability to accurately match the oscillation frequency with the reference frequency during the adjustment. As one excitation electrode 17 of crystal blank 5A is irradiated with an ion beam, which is a charged particle beam, an electron flow (i.e., electric current) is generated. This current introduces into low pass filter 3 through high frequency blocking resistor 10, and causes a voltage drop particularly by resistor 12 in the time constant circuit of low pass filter 3. As such, compensating voltage Vc which corresponds to the reference frequency and is supplied from compensating voltage generator 2 varies when it is applied to variable capacitance diodes 6. Consequently, the adjusted oscillation frequency will shift from the reference frequency even if the ambient temperature is normal.

While the shift in frequency may be previously taken into consideration for the adjustment, the shift largely varies in amount, failing to provide a practical radical solution. It should be noted that high frequency blocking resistor 10 has approximately 100 kΩ, which is too small as compared with resistor 12 of the time constant circuit which has approximately 2 MΩ, so that a voltage drop caused by resistor 10 does not particularly causes a problem. While capacitor 11 having a larger capacitance may be employed for the time constant circuit of low pass filter 3 to allow for using resistor 12 having a smaller resistance, such capacitor 11 would occupy a prohibitively large area, thus experiencing difficulties in the integration into an IC chip.

SUMMARY OF THE INVENTION

It is an object of the present invention to provide a temperature-compensated crystal oscillator which can be securely adjusted for the oscillation frequency during the manufacturing.

The object of the present invention is achieved by a temperature-compensated crystal oscillator which comprises a voltage-controlled crystal oscillator having a crystal unit, a compensating voltage generator for generating a compensating voltage applied to the voltage-controlled crystal oscillator, a low pass filter inserted between the compensating voltage generator and the voltage-controlled crystal oscillator, a switching element connected in parallel with the low pass filter for short-circuiting across the low pass filter, and control means for controlling the switching element into a conducting state when an excitation electrode of the crystal oscillator is irradiated with an ion beam for adjusting an oscillation frequency.

Specifically, the temperature-compensated crystal oscillator of the present invention has the switching element in parallel with the low pass filter inserted between the compensating voltage generator and voltage-controlled crystal oscillator. When the excitation electrode of the crystal unit is irradiated with an ion beam for adjusting the oscillation frequency, this switching element is made conductive to prevent a change in the compensating voltage supplied from the compensating voltage generator to the voltage-controlled crystal oscillator, because no voltage drop is caused by the low pass filter even if an electron flow is generated during a frequency adjustment. As a result, the adjusted oscillation frequency is prevented from shifting from a reference frequency.

DETAILED DESCRIPTION OF THE INVENTION

Figure 1:
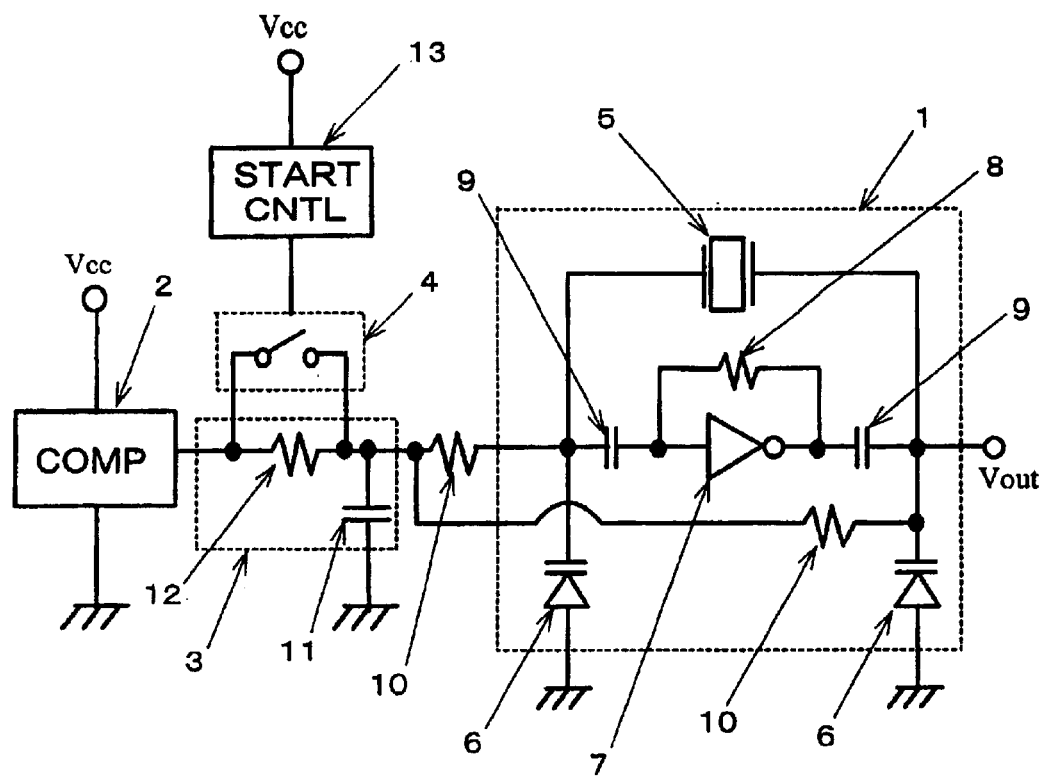
FIG. 1 is a circuit block diagram illustrating a conventional temperature-compensated crystal oscillator.
Figure 2:
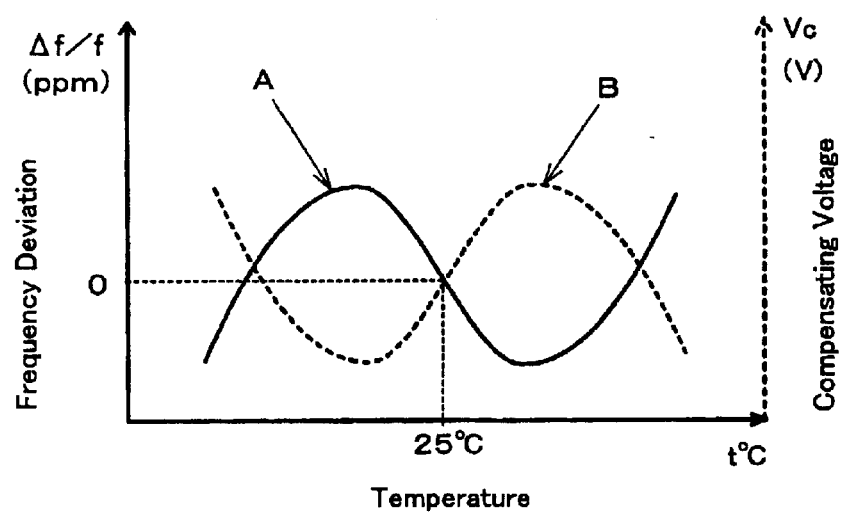
FIG. 2 is a graph illustrating the frequency-temperature characteristic of a crystal oscillator which is not compensated for temperature.
Figure 5:
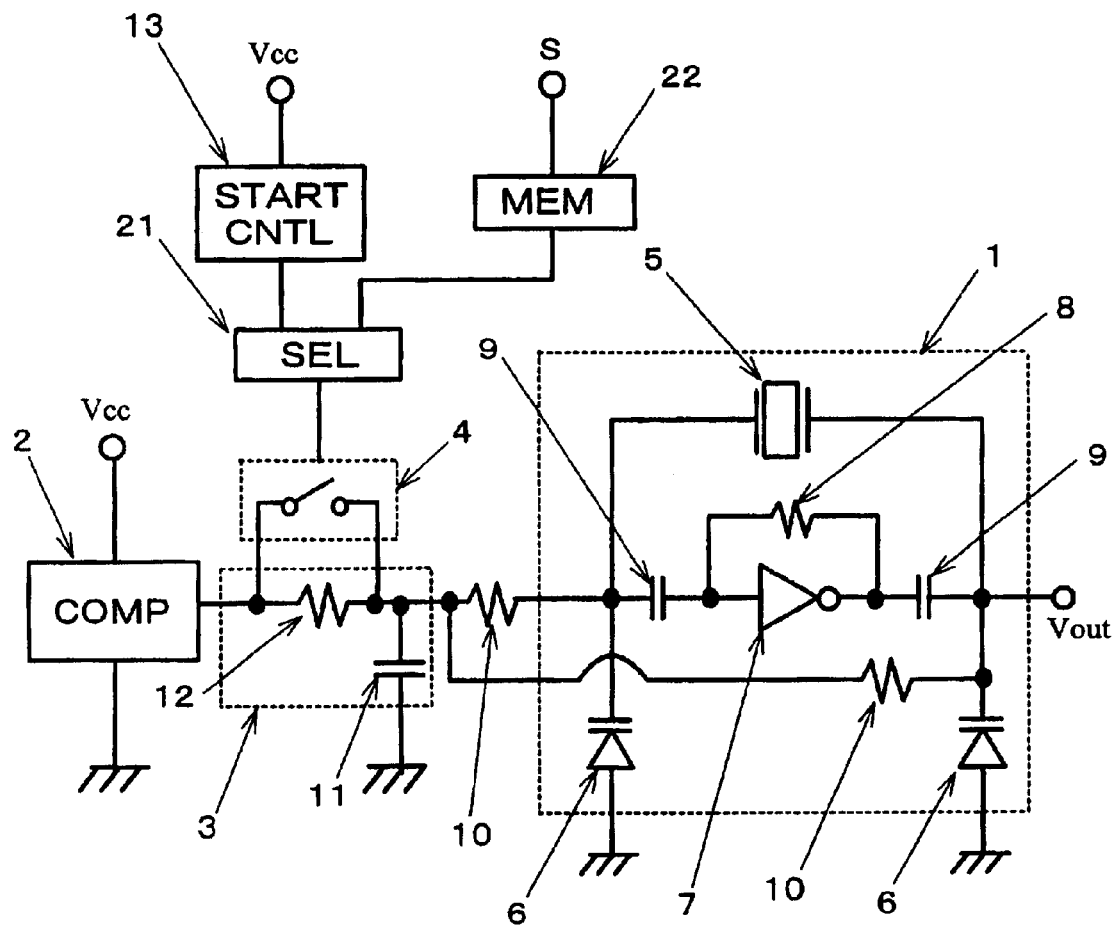
FIG. 5 is a circuit block diagram illustrating a temperature-compensated crystal oscillator according to one embodiment of the present invention.

In FIG. 5 which illustrates the circuit configuration of a temperature-compensated crystal oscillator according to one embodiment of the present invention, the same components as those in FIG. 1 are designated the same reference numerals.

Figure 3:
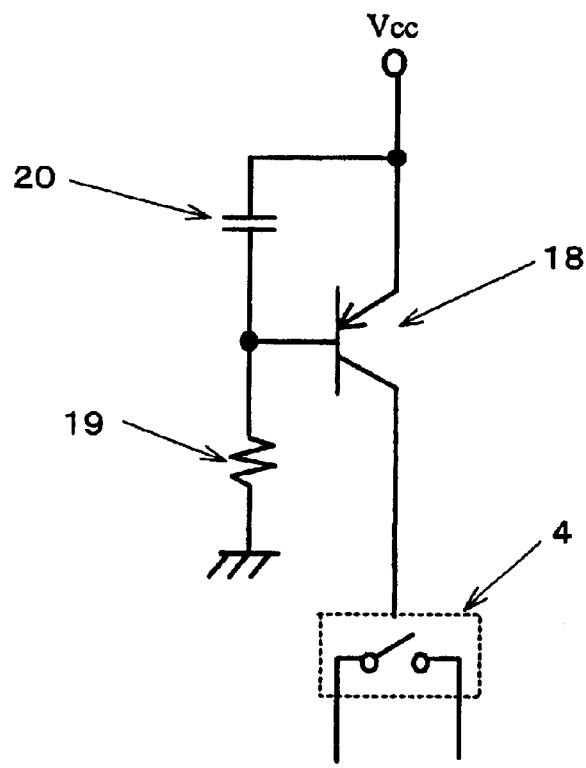
FIG. 3 is a circuit diagram illustrating a conventional starting control circuit.

The temperature-compensated crystal oscillator according to the present embodiment is similar to the conventional temperature-compensated crystal oscillator illustrated in FIG. 1 in that it comprises voltage-controlled crystal oscillator (VCXO) 1; compensating voltage generator (COMP) 2 for generating a compensating voltage based on an ambient temperature and applying the compensating voltage to voltage-controlled crystal oscillator 1; low pass filter (LPF) 3 for filtering out noise components from the compensating voltage; switching element 4 connected in parallel with low pass filter 3; and starting control circuit (START CNTL) 13 for controlling switching element 4 to short-circuit across low pass filter 3 upon starting the temperature-compensated crystal oscillator. Voltage-controlled crystal oscillator 1 includes crystal unit 5, and the respective circuit portions of voltage-controlled crystal oscillator 1 are integrated in an IC chip except for crystal unit 5. Starting control circuit 13, which is configured in a manner similar to that illustrated in FIG. 3, delivers "1" when power supply Vcc is turned on to start the crystal oscillator, and delivers "0" after the lapse of a constant time, from the starting, determined by a time constant circuit composed of resistor 19 and capacitor 20. Switching element 4, which may be comprised, for example, of MOSFET (metal-oxide-semiconductor field effect transistor) or the like, is turned on or short-circuited when "1" is applied to its control input terminal (gate terminal), and turned off or opened when "0" is applied. Switching element 4 is connected in parallel with resistor 12 of low pass filter 3.

The temperature-compensated crystal oscillator additionally comprises selector (SEL) 21 and memory (MEM) circuit 22. Selector 21, which may comprise, for example, an OR circuit having two inputs and one output, has the inputs connected to starting control circuit 13 and memory circuit 22, respectively, and the output connected to the control input terminal of switching element 4. Memory circuit 22 is connected to write terminal S disposed on the outer surface of the container body of the temperature-compensated crystal oscillator. Also, memory circuit 22 is comprised, for example, of a semiconductor memory device into which "0" or "1" is written from write terminal S. Memory circuit 22 holds the written "0" or "1" for delivery to selector 21. Selector 21 supplies "1" to the control input terminal of switching element 4 when it is applied with "1" from at least one of starting control circuit 13 and memory circuit 22, and supplies "0" to the control input terminal of switching element 4 when it is applied with "0" from both starting control circuit 13 and memory circuit 22. Thus, selector 21 can selectively control switching element 4 to be turned on or turned off. Selector 21 and memory circuit 22 are also integrated in the IC chip.

Next, description will be made on how the oscillation frequency is adjusted in the temperature-compensated crystal oscillator according to the present embodiment.

Figure 4:
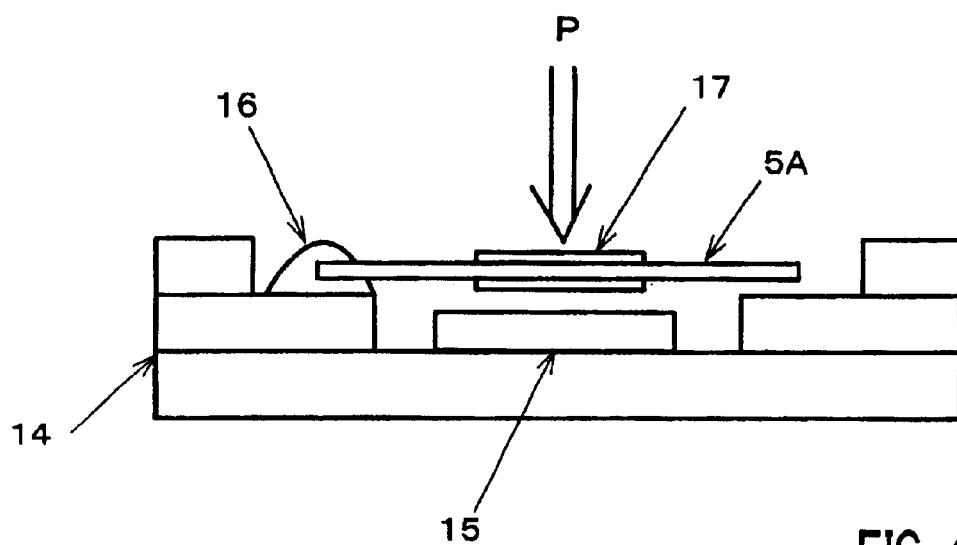
FIG. 4 is a cross-sectional view of the conventional temperature-compensated crystal oscillator.

Similar to the manufacturing process of the conventional temperature-compensated crystal oscillator illustrated in FIG. 4, the IC chip is secured on the bottom of a recess of a container body, for example, by face down bonding, and one end of a crystal blank, which constitutes the crystal unit, is secured on a step on the recess with a conductive adhesive or the like. Subsequently, an adjustment step is performed for the oscillation frequency.

In the frequency adjustment step, the temperature-compensated crystal oscillator is first powered on, and then "1" is written into memory circuit 22 from write terminal S. As a result, memory circuit 22 applies "1" to selector 21 which responsively applies a "1" signal to the control input terminal of switching element 4 which in turn short-circuits across low pass filter 3. In this case, "1" may be already written into whole memory circuit 22 as an initial value for the IC chip. It should be noted that while starting control circuit 13 also applies a "1" signal to selector 21 in response to the power-on, this "1" signal transiently alters to "0" after the lapse of a time corresponding to the time constant determined by resistor 19 and capacitor 20 within starting control circuit 13. In this crystal oscillator, selector 21 is continuously applied with the "1" signal from memory circuit 22 even after the signal from starting control circuit 13 has transitioned to "0," thereby maintaining switching element 4 in a conducting state. Then, while switching element 4 is conducting, in other words, while short-circuiting across low pass filter 3, the temperature-compensated crystal oscillator is operated to measure the oscillation frequency generated thereby, while one excitation electrode on the crystal blank is irradiated with an ion beam for adjusting the oscillation frequency.

After the adjustment is completed for the oscillation frequency, "0" is written into memory circuit 22 from write terminal S. Consequently, selector 21 is applied with "0" from memory circuit 22, and starting control circuit 13 is also delivering "0" in this event, so that selector 21 applies a "0" signal to switching element 4 which is responsively turned off. Subsequently, a lid member is provided for covering the recess of the container body to complete the temperature-compensated crystal oscillator of the present invention.

In this temperature-compensated crystal oscillator, since switching element 4 short-circuits low pass filter 3 during a frequency adjustment, an electron flow generated by the ion beam introduces into compensating voltage generator 2 through switching element 4. This eliminates a voltage drop caused by resistor 12 of low pass filter 3, thus reducing the influence on compensating voltage Vc. Consequently, a change in the oscillation frequency is prevented after the frequency is adjusted. It should be noted that compensating voltage generator 2 has an output impedance small enough to ignore a voltage drop caused by an electron flow introducing thereinto.

Next, description will be made on a normal operation of this temperature-compensated crystal oscillator.

When the temperature-compensated crystal oscillator is built in a device such as a portable telephone, write terminal S is grounded, by way of example, to store "0" in memory circuit 22. Therefore, during a normal operation, the output of selector 21 changes only in response to the output of starting control circuit 13. Then, as the device is powered on, starting control circuit 13 supplies "1" to selector 21 which responsively supplies a "1" signal to switching element 4, bringing the same into a conducting state to short-circuit across low pass filter 3. As a result, voltage-controlled crystal oscillator 1 is applied with the compensating voltage from compensating voltage generator 2 without delay, thereby maintaining a satisfactory starting characteristic of the temperature-compensated crystal oscillator. Then, the output from starting control circuit 13 transitions to "0" immediately after capacitor 11 of low pass filter 3 is charged, causing switching element 4 to be in a cut-off condition so that compensating voltage Vc is applied to voltage-controlled crystal oscillator 1 through low pass filter 3.

In the temperature-compensated crystal oscillator described above, a biasing circuit for PNP transistor 18 is implemented as starting control circuit 13 by the time constant circuit comprised of resistor 19 and capacitor 20. The present invention, however, is not limited to this configuration. Alternatively, another circuit can be used for the starting control circuit as long as it can eventually turn on (short-circuit) switching element 4 upon powering on and turn off the same immediately after the conduction. Also, memory circuit 22 is not limited to that formed within an IC chip. Alternatively, instead of providing memory circuit 22, container body 14 may be provided with a terminal connected to selector 21, such that selector 21 is applied with the "1" signal through this terminal to maintain switching element 4 short-circuited for adjusting the frequency. Moreover, the present invention can be applied to a temperature-compensated crystal oscillator which does not include the starting control circuit.

What is claimed is:

1. A temperature-compensated crystal oscillator comprising:

a voltage-controlled crystal oscillator having a crystal unit;

a compensating voltage generator for generating a compensating voltage applied to said voltage-controlled crystal oscillator;

a low pass filter inserted between said compensating voltage generator and said voltage-controlled crystal oscillator;

a switching element connected in parallel with said low pass filter for short-circuiting across said low pass filter; and control means for controlling said switching element into a conducting state when an excitation electrode of said crystal oscillator is irradiated with an ion beam for adjusting an oscillation frequency.

2. The temperature-compensated crystal oscillator according to claim 1, wherein said voltage-controlled crystal oscillator further comprises a voltage variable capacitance element connected in series with said crystal unit, said voltage variable capacitance element being applied with said compensating voltage.

3. The temperature-compensated crystal oscillator according to claim 2, wherein said voltage variable capacitance element is a variable capacitance diode.

4. The temperature-compensated crystal oscillator according to claim 1, further comprising second control means for detecting that said temperature-compensated crystal oscillator is powered on, and controlling said switching element into a conducting state for a predetermined time period from the time at which said temperature-compensated crystal oscillator is powered on.

5. The temperature-compensated crystal oscillator according to claim 1, wherein said low pass filter includes a time constant circuit consisting of a capacitor and a resistor, said switching element being connected in parallel with said resistor.

6. A temperature-compensated crystal oscillator comprising:

a voltage-controlled crystal oscillator having a crystal unit;

a compensating voltage generator for generating a compensating voltage applied to said voltage-controlled crystal oscillator;

a low pass filter inserted between said compensating voltage generator and said voltage-controlled crystal oscillator;

a switching element connected in parallel with said low pass filter for short-circuiting across said low pass filter;

a starting control circuit for generating "1" for a predetermined time after said temperature-compensated crystal oscillator is powered on and subsequently generating "0";

a memory circuit for delivering "0" or "1" in response to an external input; and a selector for controlling said switching element into a short-circuited state when at least one of said starting control circuit and said memory circuit delivers "1" and for otherwise controlling said switching element into a cut-off state.

7. The temperature-compensated crystal oscillator according to claim 6, wherein said low pass filter includes a time constant circuit consisting of a capacitor and a resistor, said switching element being connected in parallel with said resistor.

* * * * *